(12) United States Patent
Nakamori et al.

(10) Patent No.: US 6,329,268 B1
(45) Date of Patent: *Dec. 11, 2001

(54) SEMICONDUCTOR CLEANING METHOD

(75) Inventors: Masaharu Nakamori; Ichiro Honma, both of Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/199,460

(22) Filed: Nov. 25, 1998

(30) Foreign Application Priority Data

Nov. 28, 1997 (JP) .................................. 9-328572

(51) Int. Cl.$^7$ .................................................. H01L 21/20
(52) U.S. Cl. ............................................................ 438/482
(58) Field of Search ..................... 438/396, 483, 438/745, 753, 906, 913, 974; 34/443, 448, 449, 470; 134/2, 30, 31, 32, 34, 37

(56) References Cited

U.S. PATENT DOCUMENTS

| | | | |
|---|---|---|---|
| 5,092,937 | * | 3/1992 | Ogura et al ............................ 134/30 |
| 5,351,419 | * | 10/1994 | Franka et al. .......................... 34/470 |
| 5,371,950 | | 12/1994 | Schumacher . |
| 5,660,642 | * | 8/1997 | Britten ................................... 134/30 |
| 5,685,327 | * | 11/1997 | Mohindra et al. .................. 134/95.2 |

FOREIGN PATENT DOCUMENTS

| | | |
|---|---|---|
| 3-228330 | 10/1991 | (JP) . |
| 5-166777 | 7/1993 | (JP) . |
| 8-298312 | 11/1996 | (JP) . |
| 8-306646 | 11/1996 | (JP) . |
| 9-162156 | 6/1997 | (JP) . |
| 9-253639 | 9/1997 | (JP) . |
| 95-21188 | 7/1995 | (KR) . |
| 97-52694 | 7/1997 | (KR) . |

OTHER PUBLICATIONS

Japanese translation of the Korean Office Action dated Sep. 28, 2000, with partial English translation.
Korean Office Action (Japanese Translation) dated Jun. 20, 2001, with partial English translation.
Taiwanese Office Action dated Jul. 6, 2000, with partial English translation.

* cited by examiner

Primary Examiner—Keith Christianson
(74) Attorney, Agent, or Firm—McGinn & Gibb, PLLC

(57) ABSTRACT

In a method of manufacturing a semiconductor device that has an amorphous-silicon film onto which hemispherical grains are grown, a silicon wafer is cleaned at an elevated temperature using amnmonia hydrogen peroxide water solution, cleaned at an elevated temperature using chlorine hydrogen peroxide water solution, and then immersed in dilute hydrofluoric acid solution, after which it is rinsed with pure water, after which the amorphous-silicon film surface of the wafer is dried using isopropyl alcohol.

12 Claims, 4 Drawing Sheets

3 HYDROFLUORIC ACID PROCESSING TANK
6 RINSE TANK
1 1 DRYER
1 4 CHAMBER

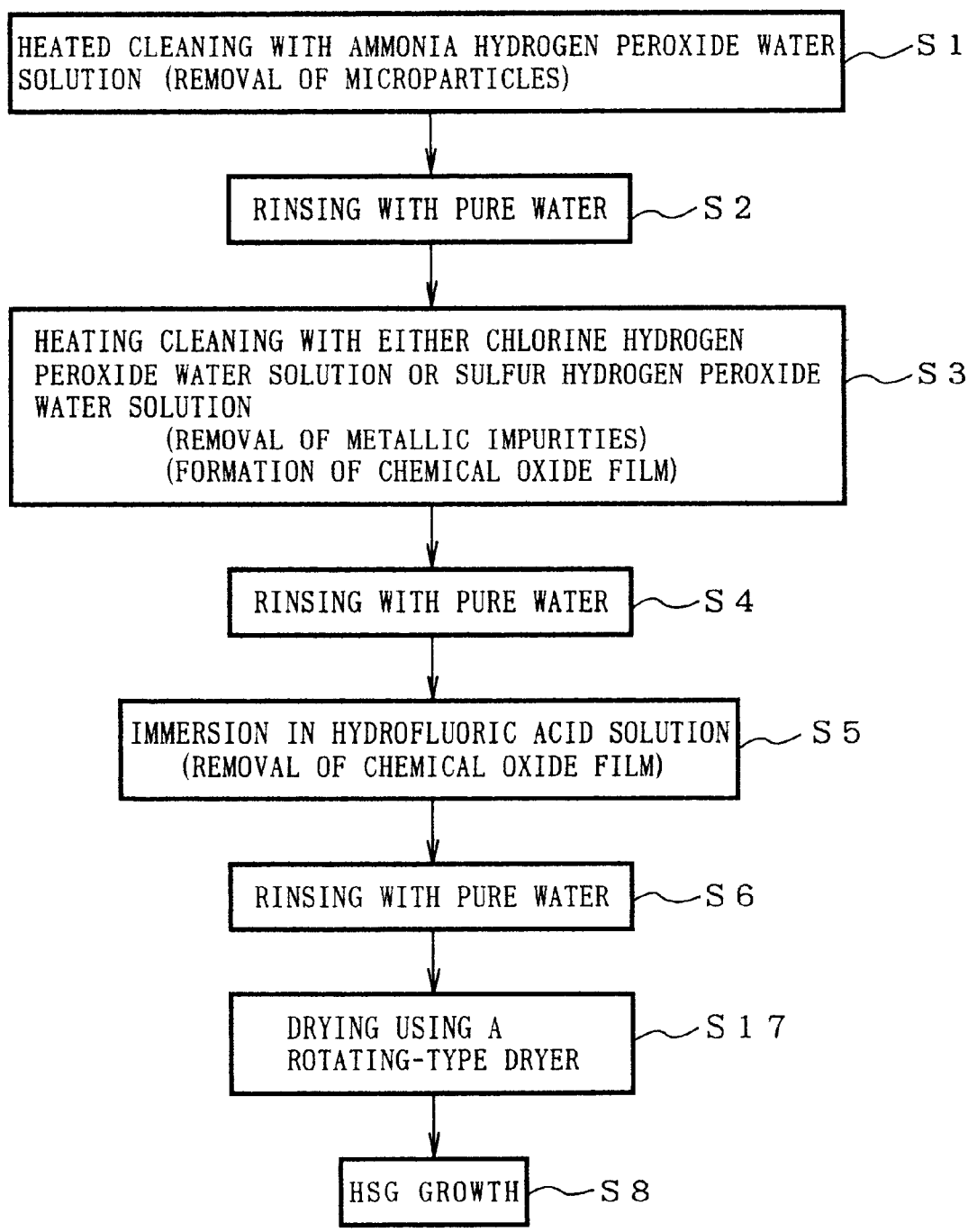

SEMICONDUCTOR CLEANING METHOD

BACKGROUND OF THE INVENTION

1. Field of the Invention

The present invention relates to a manufacturing apparatus and manufacturing method for a semiconductor device onto an amorphous-silicon film of which are grown hemispherical grains (HSGs), and more specifically to a manufacturing apparatus and manufacturing method for a semiconductor device in which watermarks do not occur on an amorphous-silicon film onto which HSGs are grown.

2. Background of the Invention

In recent years, with the shrinking of the surface area of memory cells, there has been a demand for an increase in the capacitance value of capacitive parts thereof, and for this reason investigations of such methods as applying a high-permittivity film or increasing the surface area of capacitive parts are being pursued.

To increase the surface area of a capacitor, one approach is to form a the capacitor in a three-dimensional structure. Known methods which take this approach include the method of forming a trench capacitor on a layer beneath the silicon substrate, and the method or forming a stack capacitor on a layer that is above the silicon substrate. Investigations are being made into using this stack capacitor method to increase the capacitor surface area, by making the void part of the capacitor structure in the shape of a cylinder.

One means of effectively increasing the capacitance value without the need to use microprocessing technology is a method for manufacturing a semiconductor device which is disclosed in Japanese unexamined Patent Publication (KOKAI) H8-306646, whereby hemispherical grains (HSGs) are caused to grow on an amorphous-silicon film surface during the growth thereof, thereby obtaining minute protrusions and depressions thereon.

The method of simply growing HSGs in the past will now be described, with reference made to FIG. 4. First, a silicon substrate is heated and cleaned in ammonia hydrogen peroxide solution, to remove microparticles that contaminate the surface of the amorphous-silicon surface (Step S1). The volume ratio of the mixture of ammonia, hydrogen peroxide, and water is 1:1:5, and the heated cleaning is performed for 10 minutes at a temperature of 30 to 80° C.

Then, the silicon substrate, from which microparticles have been removed from the amorphous-silicon film surface, is rinsed in pure water (Step S2), after which a cleaning liquid such as chlorine hydrogen peroxide water solution or sulfur hydrogen peroxide solution is used to perform heated cleaning, thereby removing metallic impurities that contaminate the amorphous-silicon film surface (Step S3). The volume ratio of the mixture of chlorine, hydrogen peroxide, and water is 1:1:6, and the heated cleaning is performed for 10 minutes at a temperature of 30 to 80° C. In the case of using sulfur hydrogen peroxide solution, and the heat cleaning is performed for 10 minutes at a temperature of 80° C. to 150° C.

By means of this kind of cleaning liquid for the purpose of removing metallic impurities, a chemical oxide film is formed on the surface of the amorphous-silicon film. The chemical oxide surface is formed to a thickness of 1 to 1.5 nm by the oxidizing action of the cleaning liquid. Even if an attempt is made to grow HSGs on the surface of this amorphous-silicon film onto which is formed a chemical oxide film, because the chemical oxide film inhibits the migration of silicon, HSGs do not grow. Because of this phenomenon, after rinsing the amorphous-silicon substrate onto which is formed a chemical oxide film (Step S4), it is immersed in diluted hydrofluoric acid solution having a concentration of 1% or lower, thereby removing the chemical oxide film (Step S5).

After removal of the chemical oxide film, the silicon substrate is rinsed in pure water for 10 minutes (Step S6), after which it is dried by removal of the water content from the surface thereof, using a centrifugal force type drying apparatus (Step S17). To prevent the growth of a natural oxide film on the surface of the dried amorphous-silicon film, HSGs are grown on the surface of the amorphous-silicon film immediately. Then, the capacitive film is grown, and the amorphous-silicon film surface is etched with ammonia hydrogen peroxide water cleaning solution So as to form a capacitive electrode.

Because HSGs are sensitive to contamination of the surface of the amorphous-silicon film, it is necessary to perform the proper heated cleaning and processing with dilute hydrofluoric acid solution, while taking care that the bottom layer film which causes HSG growth does not become contaminated. Contamination components which can be envisioned as affecting HSG growth on the surface of the amorphous-silicon film include air-born organic matter, a natural oxide film, and water content.

For example, in the case in which the bottom layer, such as a silicon film, is immersed in dilute hydrofluoric acid solution to remove a natural oxide film, after which the amorphous-silicon film becomes hydrophobic, even after immersion in dilute hydrofluoric acid solution and drying, there is residual water on the surface of the amorphous-silicon film. On a surface of a device that has a high aspect ratio structure, the drying at a prominent step in the surface is insufficient, so that residual water remains after drying. In particular with the method of the past in which a rotating type dryer was used to dry the surface of a amorphous-silicon film to remove water content from it, there was a tendency for residual water content to remain at such a step part. This type of residual water content encourages the local growth of a natural oxide film, thereby leading to the occurrence of watermarks. If a natural oxide film forms on the surface of the amorphous-silicon film because of watermarks or the like, HSG growth can be inhibited, there can be reduced size of the depressions and protrusions in the HSG after growth, and there can be non-uniformity in these depressions and protrusions. With a amorphous-silicon film in which these types of problems have occurred, when the amorphous-silicon film is etched by ammonia hydrogen peroxide water solution that is used for the purpose of removing microparticle contamination after formation of the capacitance film and before forming the capacitance electrode, the size of the HSG depressions and protrusions become small, so that it might not be possible to achieve a sufficient capacitance, or to achieve uniform capacitance.

Accordingly, it is an object of the present invention to provide a semiconductor device manufacturing apparatus and manufacturing method that does not cause the occurrence of watermarks on the surface of an amorphous-silicon film onto which HSG growth is done.

SUMMARY OF THE INVENTION

To achieve the above-noted object, the present invention is a semiconductor device manufacturing apparatus for manufacturing a semiconductor device that has grains grown onto an amorphous-silicon film of a wafer, said apparatus having a drying means that dries a wafer that has been wet-processed using isopropyl alcohol before the forming of said grains onto said surface.

Another aspect of the present invention is a semiconductor device manufacturing apparatus for manufacturing a semiconductor device that has grains grown onto an amorphous-silicon film of a wafer, said apparatus comprising: a wet-processing means that performs wet processing of said wafer before formation of said grains onto said amorphous-silicon film surface; a rinsing means that rinses, using pure water, said wafer that has been wet-processed by said wet-processing means; and a drying means that uses isopropyl alcohol to dry said wafer that has been rinsed by said rinsing means.

Another aspect of the present invention is that said apparatus has a chamber in the inside of which said wet-processing means, said rinsing means, and said drying means are provided, and said apparatus includes means for supplying an inert gas into said chamber.

A method of the present invention is a method for manufacturing a semiconductor device that has grains grown onto an amorphous-silicon film of a wafer, wherein before formation of said grains onto said amorphous-silicon film, a wet-processed wafer is dried by using isopropyl alcohol.

Yet another method of the present invention is a method for manufacturing a semiconductor device that has grains grown onto an amorphous-silicon film of a wafer, wherein said method comprising steps of: (1) cleaning said wafer so as to remove microparticles and metallic impurities from a surface of said amorphous-silicon film, (2) immersing said wafer in dilute hydrofluoric solution to remove from said surface of the amorphous-silicon film a chemical oxide film that was formed thereonto by said cleaning, (3) rinsing said wafer in pure water, (4) drying said wafer using isopropyl alcohol, and (5) forming grains onto the surface of the amorphous-silicon film, said steps being performed in sequence indicated by the step numbers.

And in the above-noted step (3) of rinsing the wafer using pure water, it is preferable that the concentration of dissolved oxygen in the pure water used be no greater than 10 ppb.

According to the present invention, the wet-processed wafer is dried using isopropyl alcohol before the formation thereonto of hemispherical grains. For this reason, because the method used is either one of directly replacing the residual water content at the surface by isopropyl alcohol, or one of using surface tension to remove the water content, compared with the method of using a rotating-type dryer, the efficiency of removing water is greater, the result being that it is possible to prevent the formation of a natural oxide film such as watermarks and the like when HSG growth is done onto the surface.

DESCRIPTION OF THE DRAWINGS

FIG. 4 is a process diagram that illustrates the semiconductor device manufacturing method of the prior art.

DESCRIPTION OF THE PREFERRED EMBODIMENTS

Preferred embodiments of the present invention are described in detail below, with reference being made to FIG. 1 through FIG. 3.

Figure 1:
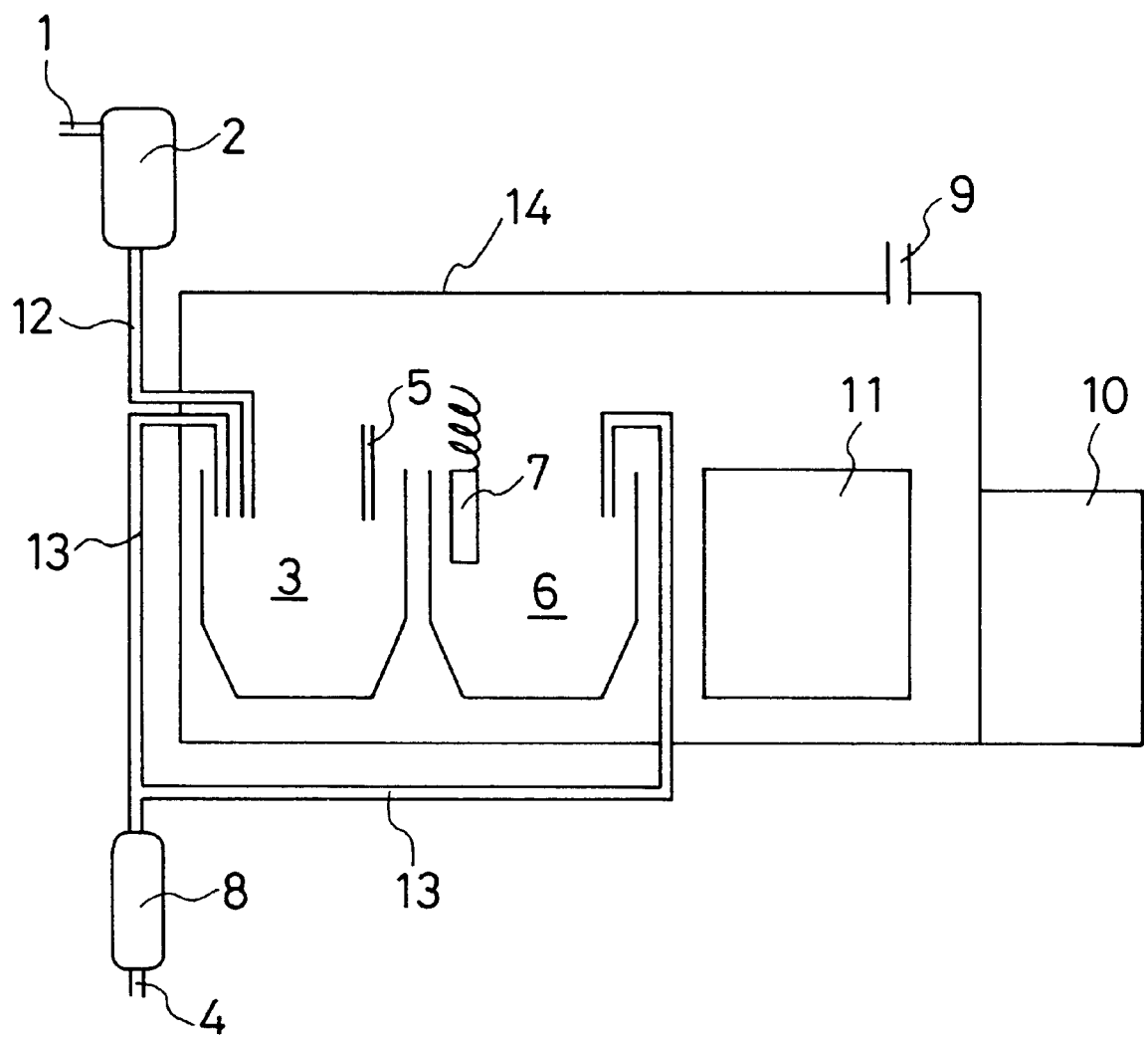
FIG. 1 is a simplified drawing that shows a semiconductor device manufacturing apparatus according to the present invention.
Figure 2:
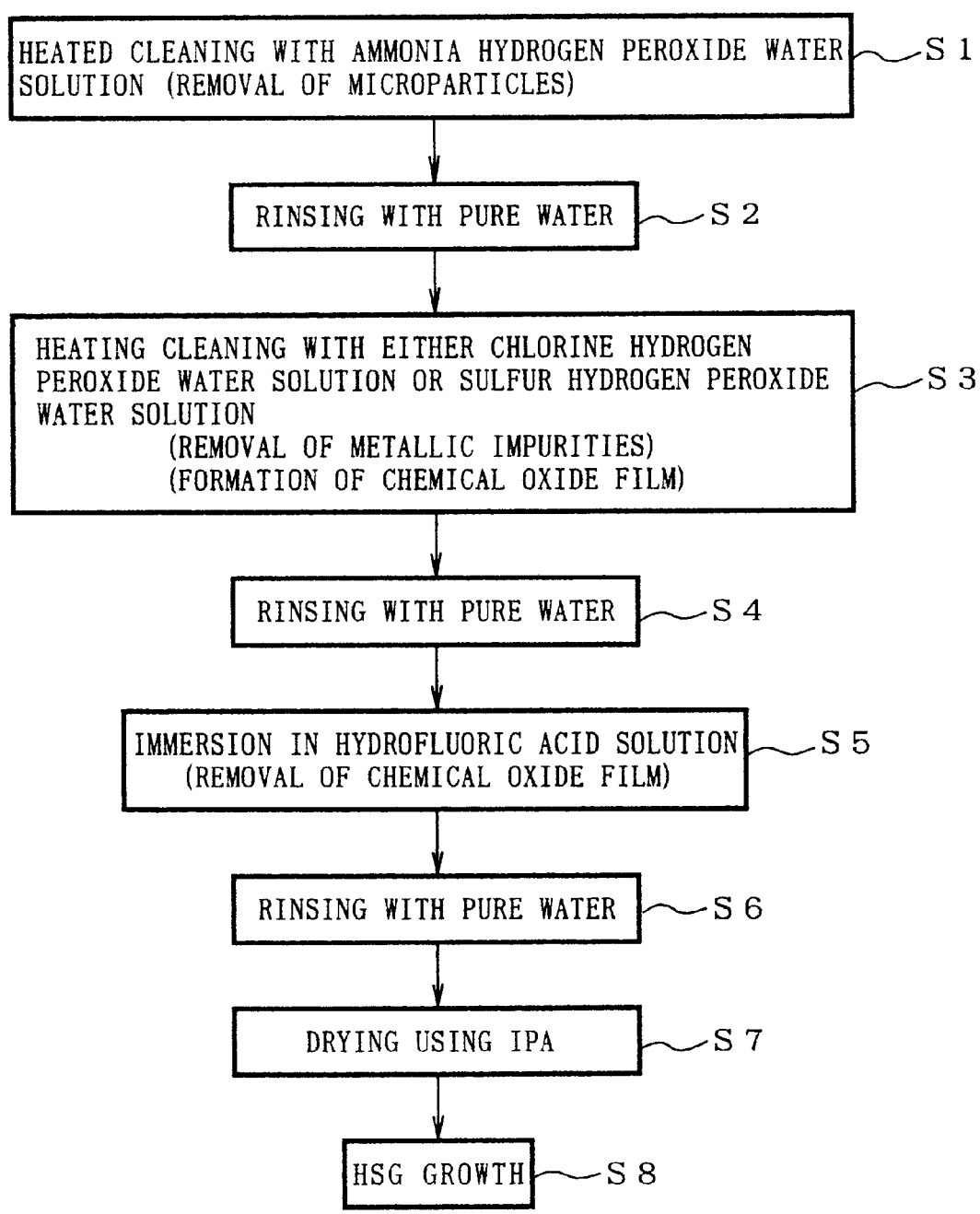
FIG. 2 is a process diagram that illustrates the semiconductor device manufacturing method according to the present invention.

As shown in FIG. 1, an apparatus for manufacturing a semiconductor device according to the present invention has, within a hermetically sealed chamber 14, a hydrofluoric acid processing tank 3, a rinse tank 6, and a dryer 11, which uses isopropyl alcohol (ISA), and also has, outside of the chamber 14, a load lock chamber 10. The drain outlet of a pipe 12 that supplies hydrofluoric acid and the drain outlet of a pipe 13 that supplies pure water for the purpose of adjusting the concentration of the hydrofluoric acid are piped into the hydrofluoric acid tank 3, so that hydrofluoric acid and pure water are mixed in the hydrofluoric acid tank 3 so form a dilute solution or hydrofluoric acid. Hydrofluoric acid ix supplied to a reservoir tank 2 by using an external supply means 1, and is supplied to the pipe 12 from the reservoir tank 2. Pure water is supplied to the hydrofluoric acid tank 3 by using an external supply means 4.

If the concentration of dissolved oxygen in the pure water that is used to adjust the concentration of the dilute hydrofluoric acid is high, a natural oxide film will be formed on a silicon wafer that is being processed within the hydrofluoric acid tank 3 Because of this situation a filter 8 is connected to the pipe 13 for the purpose of reducing the concentration of dissolved oxygen in the pure water to below 10 ppb. It is also possible, however, instead of using this filter 8, to supply pure water having a dissolved oxygen concentration of less than 10 ppb to the hydrofluoric acid tank 3 from a pure water manufacturing system.

In this manner, to adjust the concentration of the dilute hydrofluoric acid by using pure water with a reduced level of dissolved oxygen, an air sensor 5 is provided in the hydrofluoric acid tank 3 for the purpose of controlling the amount of hydrofluoric acid and the amount of pure water. It is also possible, in place of using this air sensor 5, to fix the amount of supply of pure water, and to control the amount of hydrofluoric acid by means of time, thereby achieving adjustment of the concentration of the dilute hydrofluoric acid. With either method, in the hydrofluoric acid tank 3 the liquid temperature is adjusted so as to achieve a uniform amount of etching of the oxide film by the dilute hydrofluoric acid with controlled concentration, and in order to prevent the occurrence of residual microparticles in the hydrofluoric acid tank 3, recirculating filtering is performed The drain outlet of a split section from the pipe 13 that is connected to the filter 8, which removes the above-noted dissolved oxygen from the pure water, is piped into the rinse tank 6 for the purpose of rinsing the silicon wafer with pure water. If the concentration of dissolved oxygen in the pure water in the rinse tank 6 is high, a natural oxide film is formed during the rinsing step, thereby inhibiting the growth of hemispherical grains.

In order to control the concentration of dissolved oxygen in the pure water in the rinse tank 6 to below 10 ppb, therefore, either the filter 8 is connected to the pipe 13 or, rather than using the filter B, pure water having a low concentration of dissolved oxygen is supplied to the rinse tank 6 from a pure water manufacturing system. In using this type of pure water, for the purpose of establishing the wafer rinse completion time, a resistivity meter 7 is disposed within the rinse tank 6 for the purpose of measuring the resistivity of the pure water in the rinse tank 6.

The IPA drying section 11 is the part that dries the silicon wafer using IPA. The drying method that uses IPA can be either the method in which the IPA is vaporized and caused to directly replace the water content at the surface of the amorphous-silicon film with IPA, or a method such as the Marangoni drying method, in which drying is done by picking water up into an IPA atmosphere, and any method that is capable of replacing water content at the surface of the amorphous-silicon film with IPA can be used. To control the attachment of contamination during the drying step, however, it is preferable that the Marangoni method, which does not have intrusion from the external atmosphere, be used.

The chamber 14, into which are disposed the above-noted hydrofluoric acid tank 3, rinse tank 6, and IPA-type dryer 11 is hermetically sealed, and is purged with an inert gas such as $N_2$ or argon, using an external supply means 9. This prevents the pure water of reduced dissolved oxygen content from coming into contact with the external atmosphere and dissolving oxygen therefrom, and the rinsed silicon water is dried without contamination by contaminants A load lock chamber 10 is provided to the chamber 14 to enable the supply of silicon wafers to and ejection of silicon wafers from the chamber 14, with the chamber 14 remaining hermetically sealed by the inert gas.

The semiconductor device manufacturing apparatus according to the present invention is configured as described above, and the method of manufacturing a semiconductor device according to the present invention is described below, with reference being made to FIG. 2.

In the present invention, as is the case in the prior art, heating cleaning of an amorphous-silicon film surface is done using an auxnonia hydrogen peroxide water solution, thereby removing microparticles which contaminate the amorphous-silicon film surface (Step S1). Then, after rinsing with pure water (Step S2), a cleaning liquid such as chlorine hydrogen peroxide water solution or sulfur hydrogen peroxide solution is used to perform heated cleaning, thereby removing metallic impurities that contaminate the amorphous-silicon film surface (Step S3). By performing heated cleaning using this cleaning liquid, a chemical oxide film is formed on the silicon wafer. Because the volume ratios of the cleaning liquids, and the cleaning temperatures and times are the same as in the prior art, they will be omitted from this description.

The processing by the present invention has the following features. A silicon wafer onto which is formed a chemical oxide layer is brought to the hydrofluoric acid tank 3 from the load lock chamber 10 of FIG. 1 and immersed in dilute hydrofluoric acid solution in the hydrofluoric acid tank 3, and in the cleaning process the formed chemical oxide film is cleaned away (Step S5). In this step, the concentration of the dilute hydrofluoric acid solution and the processing time can be set so as to sufficiently remove the natural oxide film from the surface of the amorphous-silicon film. Because the temperature of the dilute hydrofluoric acid solution in the hydrofluoric acid tank 3 is adjusted, the amount of etching of the oxide film is uniform, and this solution is circulated and filtered so that microparticles do not remain in the hydrofluoric acid tank 3, the result being that contaminating matter does not become attached to the surface of the amorphous-silicon film of the silicon wafer.

The silicon wafer, from which the chemical oxide film has been removed by the dilute hydrofluoric acid solution, is transferred to the rinse tank 6, where it is rinsed by pure water, thereby removing the hydrofluoric acid that is attached to the surface of the amorphous-silicon film. The completion of the rinsing operation is performed by judging from the resistivity value of the pure water used during the rinse, this being monitored by the resistivity meter 7 (Step S6). After being rinsed by pure water, the silicon wafer is transferred to within the IPA dryer 11 for the purpose of removing water content that remains on the surface of the amorphous-silicon film by the processing of drying (Step S7).

Because from the process of immersion of the silicon wafer into the dilute hydrofluoric acid solution up until the drying stage, the inside of the chamber 14 is filled with an atmosphere of either $N_2$ or argon and also because concentration of dissolved oxygen in the pure water used in the processing is no greater than 10 ppb, there is no observed growth of a natural oxide film on the amorphous-silicon film surface after the processing. A silicon wafer that is dried in this manner is ejected from the load lock chamber 10 and RSG growth is done onto the surface of the thus-processed amorphous-silicon film, after which a capacitance film is formed, whereupon this is cleaned using an ammonia hydrogen peroxide water solution. Because the HSGs are grown with good stability and the diameter of the grains is uniform, even upon etching by ammonia hydrogen peroxide water solution, sufficient depressions and protrusions of the HSGs are maintained, so that it is possible to achieve a capacitor electrode with a sufficient capacitance value.

In this specification a step of wet-processing of a wafer includes at least above described step S5 and S6.

Figure 3:
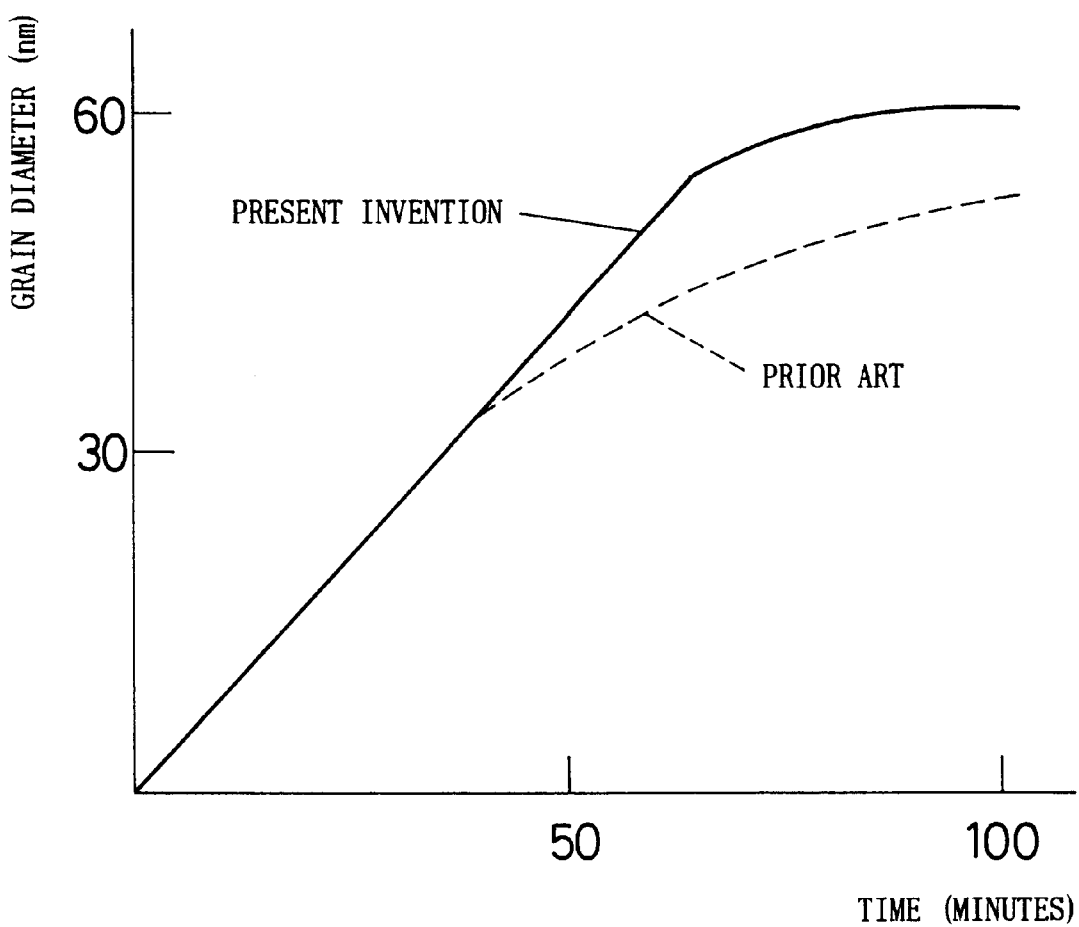
FIG. 3 is a graph that shows a comparison of HSG growth with the present invention and that in an example of prior art.

FIG. 3 shows a comparison of the HSG growth according to the present invention with that of HSG by the method of the prior art. The horizontal axis of this drawing represents the annealing time in the growth, and the vertical axis represents the grain diameter of the amorphous-silicon. The solid line shows the HSG growth according to the present invention, and the dotted line represents the HSG growth according to the method of the prior art.

As is shown by the solid line, the change in the grain diameter of HSGs grown according to the present invention is constant and growth is stable. This is a demonstration that there are no watermarks or the like caused by residual water content in the surface of the amorphous-silicon film onto which the growth was done, and that a clean amorphous-silicon film surface has been achieved. In contrast to this, as shown by the dotted line that indicates the prior art, the prior art method of HSG growth indicates that, once a certain grain diameter is reached the growth speed decreases and USG growth stops. This demonstrates that, with the prior art method of HSG growth, the occurrence of watermarks caused by residual water content in the surface of the amorphous-silicon film causes the generation of natural oxide film that inhibits USG growth. Because of this type of local natural oxide film, the position at which HSG growth on the amorphous-silicon surface is inhibited often coincides with the region of a step in the pattern thereof. This is because the use of a rotating-type dryer causes water content to remain at such steps. The present invention, however, uses IPA for drying, so that HSG growth is not inhibited even at a surface step.

It should be noted that the present invention does not present a restriction to the above-noted embodiment, and can be embodied in a variety of ways which fall within the technical scope recited in the claims therefor.

According to the present invention isopropyl alcohol is used for drying of a wet-processed wafer before HSG growth. Thus, either by directly replacing the water on the surface thereof with isopropyl alcohol or by using surface tension to remove the water content, compared with the method of using a rotating-type dryer, the present invention provides good efficiency in the removal of water content, enabling the prevention of the formation of natural oxide films such as watermarks and the like. As a result, it is possible to achieve a large grain size at the surface of the amorphous-silicon film and to achieve a sufficient capacitance with even a small surface area, and also to improve the reliability of the capacitive film.

What is claimed:

1. A method for manufacturing a semiconductor device having an amorphous-silicon film, said method comprising the steps of:
   (1) cleaning a wafer so as to remove microparticles and metallic impurities from a surface of said amorphous-silicon film;
   (2) immersing said wafer in dilute hydrofluoric acid solution to remove from said surface of said amorphous-silicon film a chemical oxide film that was formed thereon by said cleaning;
   (3) rinsing said wafer in pure water;
   (4) drying said wafer using isopropyl alcohol to remove water from said surface of said amorphous-silicon film, said drying comprising vaporizing said isopropyl alcohol and directly replacing a residual water content on a surface of said amorphous-silicon film with said isopropyl alcohol; and
   (5) forming large, substantially uniform hemispherical grains onto said surface of said amorphous-silicon film, wherein said steps are performed in sequence indicated by the step numbers and said steps 2–4 are performed in an inert gas environment.

2. A method for manufacturing a semiconductor device having an amorphous-silicon film, said method comprising the steps of:
   (1) cleaning a wafer so as to remove microparticles and metallic impurities from a surface of said amorphous-silicon film;
   (2) immersing said wafer in dilute hydrofluoric acid solution to remove from said surface of the amorphous-silicon film a chemical oxide film that was formed thereonto by said cleaning;
   (3) rinsing said wafer in pure water;
   (4) drying said wafer using isopropyl alcohol to remove water from said surface of said amorphous-silicon film, said drying comprising picking water up into an isopropyl alcohol atmosphere; and
   (5) forming large, substantially uniform hemispherical grains onto said surface of said amorphous-silicon film; said steps being performed in sequence indicated by the step numbers and said steps 2–4 performed in an inert gas environment.

3. The method for manufacturing a semiconductor device according to claim 2, wherein at step (3) of rinsing said wafer in pure water, said pure water has a concentration of dissolved oxygen that is no greater than 10 ppb.

4. The method for manufacturing a semiconductor device according to claim 1, wherein said surface of said amorphous-silicon film is devoid of watermarks after said drying said wafer.

5. The method for manufacturing a semiconductor device according to claim 1, wherein said grains form depressions and protrusions on a surface of said amorphous-silicon film.

6. The method for manufacturing a semiconductor device according to claim 1, wherein residual water content on a surface of said amorphous-silicon film encourages a growth of natural oxide film.

7. The method for manufacturing a semiconductor device according to claim 1, wherein residual water content on a surface of said amorphous-silicon film inhibits a growth of said hemispherical grains.

8. The method for manufacturing a semiconductor device according to claim 1, wherein said removing water comprises placing said wafer into a hermetically sealed chamber and purging said chamber with an inert gas.

9. The method for manufacturing a semiconductor device according to claim 8, wherein atmospheric oxygen is prevented from dissolving into said pure water.

10. The method for manufacturing a semiconductor device according to claim 1, further comprising monitoring a resistivity value of said pure water during said rinsing of said wafer.

11. The method for manufacturing a semiconductor device according to claim 1, further comprising:
    after forming said large, substantially uniform grains, forming a capacitance film on said grains; and
    cleaning said wafer with an ammonia hydrogen peroxide water solution.

12. The method for manufacturing a semiconductor device according to claim 1, wherein said capacitance film comprises a high reliability capacitance film.

* * * * *